US008444915B2

(12) United States Patent  (10) Patent No.: US 8,444,915 B2
Berardan et al.  (45) Date of Patent: May 21, 2013

(54) MAKING THERMOELECTRIC MATERIALS BY MECHANOSYNTHESIS

(75) Inventors: David Berardan, Manziat (FR); Eric Alleno, Saint Maur (FR); Claude Godart, La Baule (FR); Eric Leroy, Les Ulis (FR)

(73) Assignee: Centre National de la Recherche Scientifique (CNRS) (FR)

( * ) Notice: Subject to any disclaimer, the term of this patent is extended or adjusted under 35 U.S.C. 154(b) by 939 days.

(21) Appl. No.: 11/887,883

(22) PCT Filed: Apr. 5, 2006

(86) PCT No.: PCT/EP2006/061338
§ 371 (c)(1),
(2), (4) Date: Jan. 26, 2009

(87) PCT Pub. No.: WO2006/106116
PCT Pub. Date: Oct. 12, 2006

(65) Prior Publication Data
US 2009/0208364 A1  Aug. 20, 2009

(30) Foreign Application Priority Data
Apr. 6, 2005 (FR) ...................................... 05 03417

(51) Int. Cl.
B22F 9/04 (2006.01)
B02C 17/00 (2006.01)
(52) U.S. Cl.
USPC .................................... 419/66; 75/352; 241/5
(58) Field of Classification Search
USPC ........................................................ 75/352
See application file for complete search history.

(56) References Cited

U.S. PATENT DOCUMENTS 5,929,351 A * 7/1999 Kusakabe et al. ................ 75/228
6,222,242 B1 * 4/2001 Konishi et al. ................. 257/467
8,006,741 B2 * 8/2011 Nakajima ...................... 164/122

FOREIGN PATENT DOCUMENTS

| CN | 1594623 A | * | 3/2005 |
| JP | 11040860 A | | 2/1999 |
| JP | 2004076046 A | | 3/2004 |
| JP | 2004130305 A | | 4/2004 |
| WO | 2004049464 A1 | | 6/2004 |

OTHER PUBLICATIONS

Chapon, L et al: "Synthése par broyage méchanique de CeFe4Sbl2 et des composes substitués CeFe3,5NiO,5Sbl2 et CeFe4Sb11Te" Comptes Rendus De L'Academie Des Sciences Serie II C, 1998, pp. 761-763.

(Continued)

*Primary Examiner* — George Wyszomierski
(74) *Attorney, Agent, or Firm* — Lerner, David, Littenberg, Krumholz & Mentlik, LLP

(57) ABSTRACT

The invention concerns a method for making a thermoelectric element consisting mainly of a crystalline alloy having a cubic structure, the alloy comprising a first constituent having at least a first element selected among the transition metals, a second constituent having at least one element selected among column XIV, XV or XVI of the periodic table, and a third constituent having at least one constituent selected among rare earths, alkalis, alkaline earths or actinides. The method includes making the alloy in the form of nanopowders by mechanosynthesis. The invention also concerns the thermoelectric material obtained by implementing said method.

17 Claims, 3 Drawing Sheets

OTHER PUBLICATIONS

Figure 1:
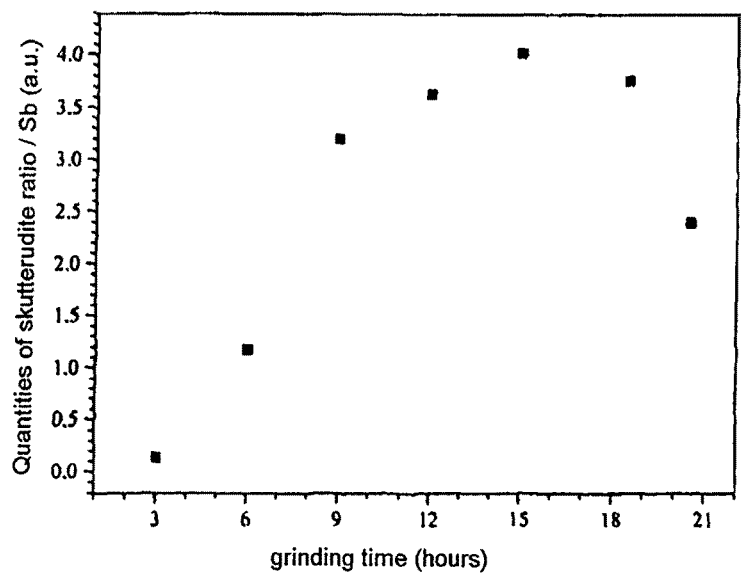

Jiyang Wang et al: "Progress in skutterudite-based thermoelectric materials" Thermoelectrics, 2001. Proceedings ICT 2001. XX International Conference on Jun. 8-11, 2001, Piscataway, NJ, USA, IEEE, pp. 89-92.

Peng J et al: "Preparation and characterization of Fe substituted CoSb3 skutterudite by mechanical alloying and annealing" Journal of Alloys and Compounds, Elsevier Sequoia, Lausanne, CH, vol. 381, No. 1-2, Nov. 3, 2004, pp. 313-316.

Yang L et al: "Synthesis of filled skutterudite compound LaO.75Fe3CoSbl2 by.spark plasma sintering and effect of porosity on thermoelectric properties" Journal of Alloys and Compounds, Elsevier Sequoia, Lausanne, CH, vol. 364, No. 1-2, Feb. 11, 2004, pp. 83-88.

Katsuyama S et al: "Thermoelectric properties of CoSb3 with dispersed FeSb2 particles" Journal of Applied Physics, American Insiituie of Physics. New York, US, vol. 88, No. 6, Sep. 15, 2000, pp. 3484-3489.

Bertini Luca et al: "Nanostructured Col-xNixSb3 skutterudites: Synthesis, thermoelectric properties, and theoretical modeling" Journal of Applied Physics, American Institute of Physics. New York, US, vol. 93, No. 1, Jan. 1, 2003, pp. 438-447.

Toprak N S et al: "The Impact of Nanostruciuring on the Thermal Conductiviiy of Thermoelectric COSB3" Advanced Functional Materials, Wiley VCH, Wienheim, DE, vol. 14, No. 12, Dec. 2004, pp. 1189-1196.

Berardan D et al: "Thermoelectric properties of the new skutterudites (Ce-Yb)3Fe4-x(Co/Ni )xSbl2" Thermoelectrics, 2003 Twenty-Second International Conference on—ICT La Grande Motte, France Aug. 17-21, 2003, Piscataway, NJ, USA,IEEE, pp. 64-67.

International Search Report, PCT/EP2006/061338, mailed Sep. 14, 2007.

* cited by examiner

MAKING THERMOELECTRIC MATERIALS BY MECHANOSYNTHESIS

The present invention relates to the field of thermoelectric materials of skutterudite type and processes for producing such materials.

The chief aim of assays currently being performed on thermoelectric materials, as well as research for finding or making novel thermoelectric materials or novel structures of materials is to boost the efficacy of the latter.

Thus, the efficacy of a thermoelectric material utilised for heat conversion into electric power can be estimated by means of the factor of merit, designated ZT. This factor increases when the thermoelectric power, the conductivity electric and the inverse of the thermal conductivity of the material increase.

Empty or binary skutterudites, of general formula $MX_{3+x}$ are crystalline materials which exhibit fairly high factors of merit due to the fact of their strong thermoelectric powers, $x \in ]-0.2; 0.2[$, M being a metal of line IV, V or VI of the periodic table, and X being an element of column XIV, XV or XVI of the periodic table. Binary skutterudites crystallise in a centred cubic structure (space group Im3), M atoms occupying crystallographic positions 8c (¼, ¼, ¼), and the atom X occupying positions 24g (0, y, z).

Filled or partially filled skutterudites of general simplified formula $(R_{1-t}R'_t)_y M_x M'_{4-x} X_z X'_{12-z}$ are part of the most promising recent materials for thermoelectric applications; they can in fact have an even higher factor of merit than that of binary skutterudites, "y" $\in ]0; 1)$, "x" $\in [0; 4]$, "z" $\in [0; 12]$, M and M' being metals of line IV, V or VI of the periodic table, X and X' being elements of column XIV, XV or XVI of the periodic table; R and R' being electropositive elements or a mixture of electropositive elements (i.e. an element of valency of between 1 and 4, selected from alkalines, alkaline earths, rare earths and actinides in the periodic table). It should be noted that filled skutterudites can have a more complete general formula where the number of elements R, M and X is not limited. It can then be written $(R, R', \ldots R'')_y (M, M', \ldots M''')_4 (X, X1, -X^p)_{12}$ or n, m, p are whole numbers.

The presence of the R atom differentiates filled or partially filled skutterudites from empty or binary skutterudites. In addition, it is often preferable to substitute some M atoms by M' atoms adapted to adjust the number of valency electrons so as to retain the semi-conductor or semi-metallic character. The R atom, situated at the centre of a voluminous cage in position 2a (0, 0, 0), can vibrate about its position of equilibrium independently of the vibrations of the network.

Therefore, the contribution of phonons to thermal conductivity is diminished, which increases the factor of merit without necessarily decreasing the electrical conductivity.

The lowest contributions of phonons to thermal conductivity have thus been observed in the filled or partially filled skutterudites of formula $(R_{1-t}R'_t)_y M4_{-x} M'_x X_{12}$.
The filled skutterudites thus have high factors of merit (ZT~1 close to 400° C.), and are of type n (conduction by electrons) or type p (conduction by holes).

Hereinbelow, we will consider that a powder is constituted by monocrystalline or polycrystalline grains of material.

In addition, it is possible to increase the factor of merit when the material grain size decreases, which is in particular the case for nanocrystalline grains of material, whereof the size is of the order of, or less than, a few hundreds of nanometers. In fact, by decreasing the material grain size, the average free course of the phonons is limited, which decreases their contribution to thermal conductivity.

However, the decrease in material grain size of skutterudite is limited due to the fact of thermodynamic instability which this material then presents, especially in the case where the skutterudite is filled or pseudo-filled.

A first known classic production method for skutterudites in the pulverulent state consists first of synthesising by fusion then conducting long-duration annealing prior to grinding. The production is thus extremely long (from one to several days) and energy-costly, especially during annealing.

A second known production method for skutterudites in the nanocrystalline state is synthesis of skutterudites by chemistry in solution.

To this end, a first technique consists of producing nanowires of $CoSb_3$ by electrochemical processing. This first technique however requires subsequent annealing.

A second synthesis technique consists of making nanowires from $NaFe_4P_{12}$ by hydrothermal processing then annealing. Inclusions and nickel or tellurium doping in the nanowires have also been tried.

A third synthesis technique consists of making nanopowders from $CoSb_3$, a nanopowder being a powder (such as defined above) constituted by grains of material each of a size less than a micrometer. To this end, co-precipitation is carried out, followed by calcination in air and reduction under hydrogen. Characterisation by diffraction of X-rays of the matter obtained however proves to be insufficiently precise, and the processing too complex to perform (Bertini et coll. "Nanostructured $Co_{1-x}Ni_xSb_3$ skutterudites: Synthesis, thermoelectric properties, and theoretical modeling", Journal of Applied Physics, 93 (1), p. 438 (2003)).

A fourth technique consists of making nanopowders (defined above) from CoSb3 by spray pyrolysis (known as "spray pyrolysis") followed by reduction under hydrogen (Wojciechowski et coll. "Microstructure and transport properties of nanograined powders of CoSb3 obtained with the spray pyrolysis method", Proc. 22nd International Conference on Thermoelectrics ICT2003, The Grande Motte, France, August 2003, p. 97).

Conducting these different synthesis techniques of skutterudites in a state close to nanocrystalline seems however difficult to envisage in an industrial context, the latter being too complex to carry out and/or providing the material in inadequate quantities.

In addition, it would probably be difficult, or even impossible, to obtain filled skutterudites from these techniques since all are based on chemistry in solution.

A third known production method for skutterudites is synthesis of skutterudites by mechanical grinding.

To this end, a first known grinding technique consists of preparing filled skutterudites by means of short and violent mechanical grinding (Chapon et coll. "Mechanical alloying of $CeFe_4Sb_{12}$ and substituted compounds $CeFe_{3.5}Ni_{0.5}Sb_{12}$ and $CeFe_4Sb_{11}Te$" Proceedings of the Academy of Sciences. Series II c, p761-763 (1998)).

However, the technique utilised causes considerable contamination of the powder produced, especially by alumina coming from the crucible and the balls utilised for grinding. In addition, there is a not insignificant quantity of non-alloyed antimony in the powders. Finally, the average material grain size obtained is approximately 10 micrometers, which is a very considerable size.

A second known grinding technique consists of preparing CoSb3 by mechanical grinding (document CN 1422969; and "Synthesis of CoSb3 skutterudite by mechanical alloying" by Yang et coll., in Journal of Alloys and Compounds, 375, p. 229 (2004)).

However, this technique produces binary skutterudites only, and not filled. In addition, to obtain good purity for the CoSb3 powder (that is the lowest possible quantity of parasitic phases), after grinding it is necessary to conduct annealing at at least 700° C. probably involving substantial crystalline growth and energy costs.

The document by Jiangying Peng et al. entitled "Preparation and characterization of Fe-substituted CoSb3 skutterudite by mechanical alloying and annealing" (Journal of alloys and compounds, Elsevier Sequoia, Lausanne, Switzerland, vol. 381, No. 1-2, 3 November 2004, pp. 313-316) divulges a similar technique.

The grains obtained have an average size of between approximately 9 and approximately 20 micrometers, calculated from photos taken by electronic microscopy by using a rule of three.

An aim of the invention is to employ a technique for production of skutterudites having thermoelectric properties in the form of nanopowders (defined hereinabove) without necessarily employing a high-temperature annealing step.

Another aim of the invention is to produce skutterudites in the form of powders whereof the forms and sizes of grains facilitate subsequent shaping and equaling or improving the thermoelectric properties of the material. Another aim of the invention is to produce skutterudites having good purity, with a quantity of small parasitic phases.

Another aim of the invention is to produce filled skutterudites having good purity, with a low quantity of parasitic phases.

Another aim of the invention is to find a technique for production of skutterudites enabling industrial production (i.e. production in sufficient quantities on an industrial scale, and reproducible).

Another aim of the invention is to obtain a material remaining stable up to high temperatures of the order of 600° C.

To attain these aims the invention proposes, according to a first aspect, a process for making a material having good thermoelectric characteristics, constituted mainly by a crystalline alloy having a cubic structure, the alloy comprising:
- a first constituent having one or more first element(s) selected from transition metals (lines IV, V or VI of the periodic table);
- a second constituent having one or more second element(s) selected from column XIV, XV or XVI of the periodic table;
- a third constituent having one or more third element(s) selected from rare earths, alkalines, alkaline earths or actinides or a mixture of these elements; characterised in that the process comprises making the alloy by mechanosynthesis, and in that mechanosynthesis is carried out so as to mainly produce powders whereof the average grain size is less than approximately 500, or even less than approximately 100 nanometers.

Other possible characteristics of this production process of a thermoelectric element are:
- the average size of grains of powder is less than approximately 100 nanometers;
- a first element is Fe, a second element is Sb, a third element is Ce, the starting materials utilised for the mechanosynthesis comprise Sb, Fe—Sb and Ce—Sb whereof the proportions are selected so as to obtain the desired composition of the alloy;
- a first element is Fe, a second element is Sb, a third element is Yb, the starting materials utilised for mechanosynthesis comprise Sb, Fe—Sb and Yb—Sb whereof the proportions are selected so as to obtain the desired composition of the alloy;
- a starting material used can be mischmetal;
- mechanosynthesis is carried out on starting materials in the form of powders or leaves or more voluminous macroscopic pieces, the starting materials selected able to be pure materials or alloys;
- mechanosynthesis is carried out so as to obtain a powder constituted by at least 95% of skutterudite phase;
- mechanosynthesis is carried out such that the worked material does not exceed a temperature limit less than the melting temperature of any of the elements of the material;
- the mechanosynthesis device used is employed continuously without dwell time;
- the mechanosynthesis device used is employed over several work time periods separated by dwell time periods long enough for the temperature of the worked material to decrease well beyond said temperature limit;
- mechanosynthesis is employed so as to contribute work of between approximately 85 kilojoules and approximately 430 kilojoules;
- mechanosynthesis is employed so as to contribute a specific shock power of between approximately 2 and approximately 10 Watts per gram of product;
- a specific shock power of approximately 4 Watts/gram of product is used;
- the mechanosynthesis device is a planetary grinder comprising balls, a jar and a tray, and each work time period lasts between 1 hour and 5 hours for a rotation speed of the jar of between approximately 750 and 1250 rpm, a rotation speed of the tray of between 400 and 600 rpm, and balls selected such that the mass ratio of the balls to total mass of starting product is between approximately 10 and 20;
- the mechanosynthesis device is made of a material not likely to contaminate the alloy during mechanosynthesis, such as steel;
- mechanosynthesis is carried out under inert gas atmosphere such as argon or optionally nitrogen;
- the process further comprises a compacting step for powders obtained after mechanosynthesis, for making said thermoelectric element.

In accordance with a second aspect, the invention proposes grains of powder having thermoelectric properties constituted mainly by a crystalline alloy having thermoelectric properties and having a cubic structure, the alloy comprising:
- a first constituent having one or more first element(s) selected from transition metals;
- a second constituent having one or more second element(s) selected from column XIV, XV or XVI of the periodic table;
- a third constituent having one or more third element(s) selected from rare earths, alkalines, alkaline earths and actinides or a mixture of these elements; characterised in that the grains of powder have an overall ovoid form and an average size less than 500 nanometers, or even 100 nanometers.

Other possible characteristics of these grains of powder are:
- the elements M, M', . . . Mn of the first constituent are selected from the following elements: Fe, Co, Ni, Ru, Rh, Pd, Os, Ir, Pt;
- the elements X, XI', . . . $X^P$ of the second constituent are selected from the following elements: P, As, Sn, Sb, Si, Ge and Te;
- the elements R, R', . . . , $R_m$ of the third constituent are selected from the following elements: La, Ce, Pr, Nd, Eu, Yb, Ba, Na, K, Ca, Ti, Sr, U;

the alloy is $Ce_yFe_{4-x}Co_xSb_{12}$, $Ce_yFe_{4-x}Ni_xSb_{12}$, $Yb_yFe_{4-x}Ni_xSb_{12}$ or $Yb_yFe_{4-x}Co_xSb_{12}$, with x respectively between 0 and 4 and y a real non-zero number less than 1;

it is monophased;

it is polycrystalline.

In accordance with a third aspect, the invention proposes a thermoelectric material characterised in that it is mainly formed by a multitude of these nanocrystalline grains of powder, in pulverulent or compacted form.

Other characteristics, aims and advantages of the invention will emerge from the following description, which is purely illustrative and non-limiting, and which will be considered with respect to the attached figures, in which:

FIG. 1 shows the relative evolution of the quantity of skutterudite, relative to that of Sb, produced as a function of the grinding time in the conditions of the invention.

Figure 2:
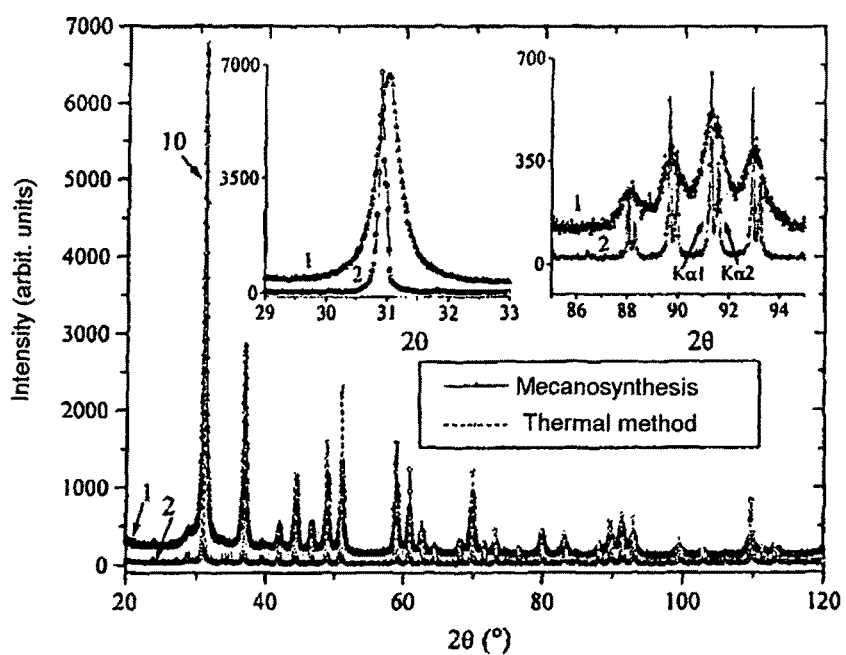

FIG. 2 presents experimental results of diffraction measurements of X-rays taken comparatively on a powder obtained according to the invention and on a powder obtained according to a conventional technique, showing that the two phases are the same and that the powders obtained according to the invention have a nanometric grain size.

Figure 3:
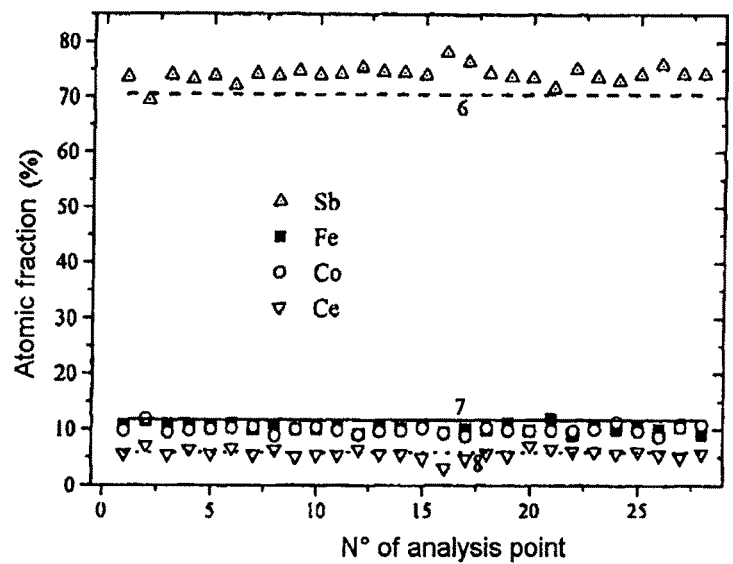

FIG. 3 shows the compositions of several grains of a powder obtained according to the invention, the compositions having been found from measurements by X-ray spectroscopy dispersed in wavelength (known as EDX spectroscopy for "Energy Dispersive X ray"). It shows the homogeneity of the phase produced.

Figure 4:
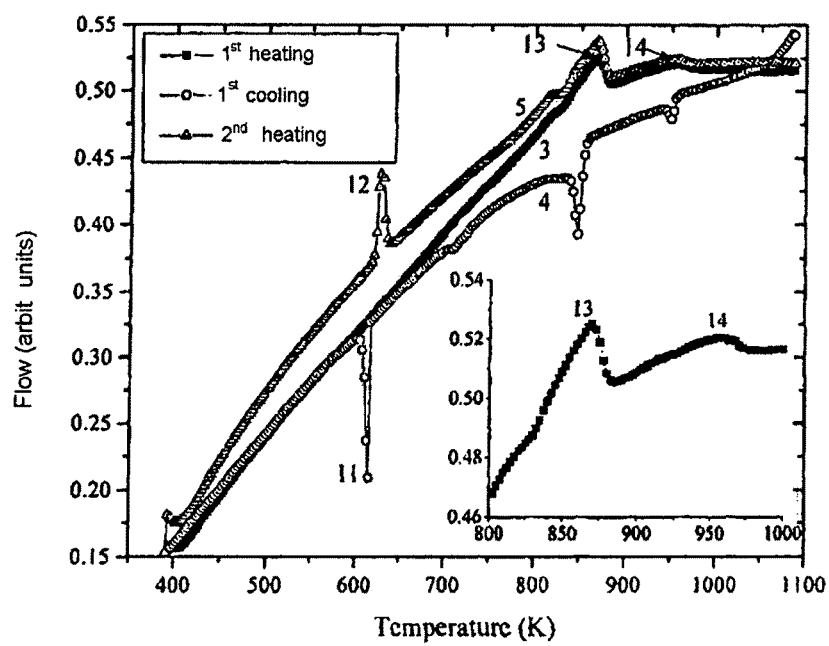

FIG. 4 presents experimental results of differential thermal analysis measurements (known as DTA) taken on a powder obtained according to the invention, especially showing its thermal stability up to 600° C.

Figure 5:
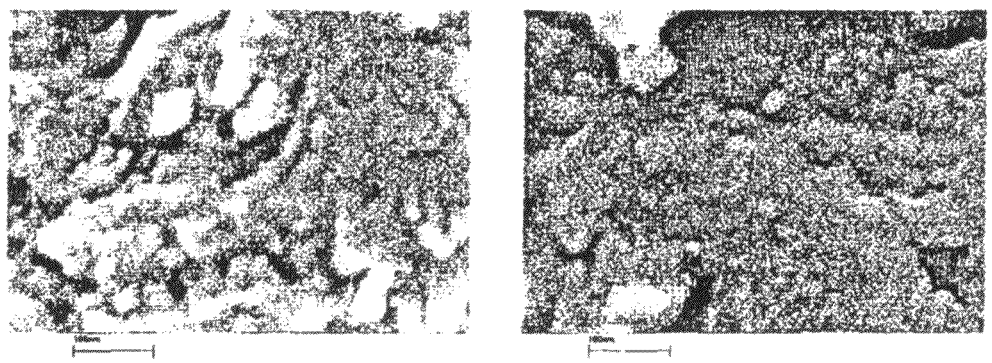

FIG. 5 is a photo obtained by electronic microscopy with enlargement×200,000 showing that the grains of material, for different types of powders, when they are isolated (and not clumped together), have dimensions of generally between 15 and 50 nanometers.

Figure 6:
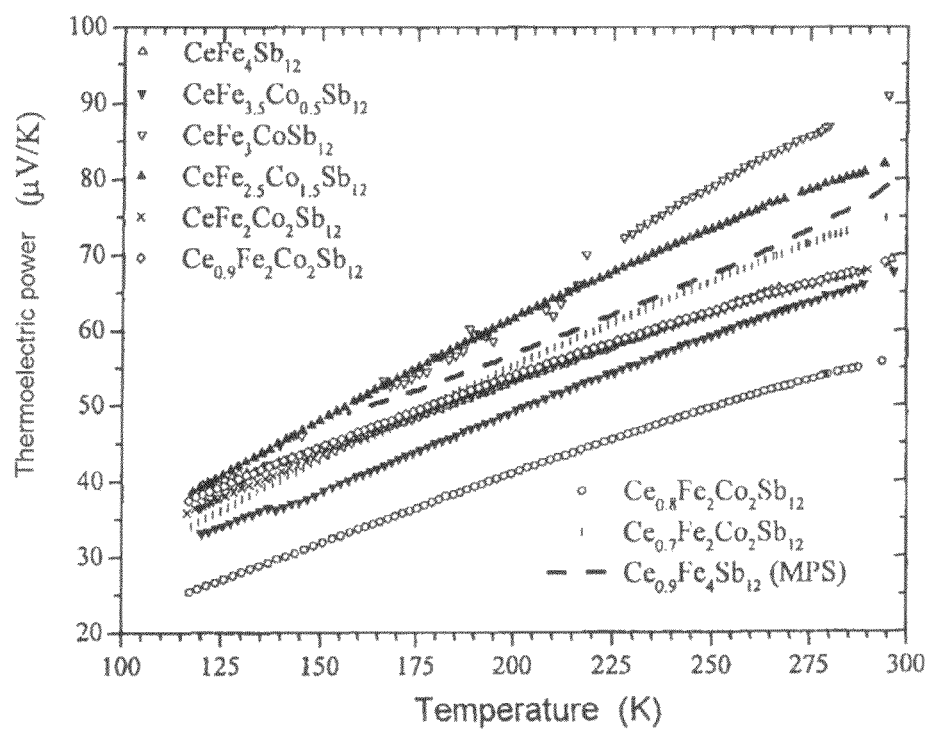

FIG. 6 presents experimental results of measurements of thermoelectric power, as a function of the temperature, samples of powders obtained according to the invention and compacted, for different types of powder.

The values are comparable to those obtained for a sample prepared by other preparation techniques.

The invention proposes making a material based on skutterudite alloy having substantial thermoelectric power, by mechanosynthesis. Mechanosynthesis can be defined as a mechanical process of materials synthesis (alloy compounds, etc.) by cogrinding dry or in the presence of a control agent of the process, from a starting material constituted by pure or pre-alloyed elements in a high-energy grinder, to obtain powders.

A pulverulent material having very small grains (average size of material grains being a few hundreds of nanometers maximum), monophased or polyphased, constituted by stable or metastable alloy can be obtained.

It is the energy discharged by the grinding which will enable synthesis of the alloy. In fact, the starting material undergoes successive violent mechanicals shocks (causing exothermal reactions) and is the subjected to a succession of adhesion (welding) and separation (decohesion) of particles.

The means necessary for working pulverulent alloys by mechanosynthesis are the following:

elementary or pre-alloyed compounds forming the starting material(s), and comprising the elements of the material to be worked in the desired proportions;

shock means for grinding the worked material, which is in general constituted by balls of hard material;

means for creating a type of movement permitting successive shocks of the balls with the material;

a closed medium or container or jar in which mechanosynthesis takes place under controlled atmosphere.

The material making up the container is preferably selected so as not to cause pollution of the worked material. Steel will be selected, for example.

The material making up the balls is selected so as to have an adjusted hardness for having good efficacy for transfer of shocks while avoiding excessive contamination of the worked material. The choice will thus be steel. The ratio of number of balls to total mass of powder to be produced is further adjusted for a frequency of shocks determined as optimal, for a determined speed of balls.

The mechanosynthesis device comprises internal means which create movement, communicate with the balls, according to techniques which can be different according to the type of grinder used. For example, a grinder of attrition type, a horizontal grinder, a vertical vibration grinder, or a planetary grinder could be used.

The grinder used by the applicant throughout this document to make the powders is a planetary grinder equipped with steel jars and a tray, the jars being in relative movement relative to the tray itself mobile, thus imprinting movement to the steel balls. Similar results could have been obtained with other types of grinders.

The pulverulent material to be obtained according to the invention is constituted by skutterudite, specifically a cubic crystalline alloy comprising:

a first constituent having at least a first element "M" selected from transition metals.

a second constituent having at least a second element "X" selected from column XIV, XV or XVI of the periodic table. In accordance with a first variant the skutterudite is binary or empty, of formula $MX_{3+X}$, such as defined above.

In accordance with a second variant, the skutterudite is filled or partially filled, and the alloy further includes:

a third constituent having at least a third element "R" selected from rare earths, alkalines, alkaline earths or actinides or a mixture of these elements.

Optionally, the first constituent can further comprise another element selected from transition metals, this alloy able to have as formula $R_yM_xM'_{4-x}X_zX'_{12-z}$ or $(R, R', \ldots R''')_y(M, M', \ldots M''')_4 (X, X', \ldots X^p)_{12}$, such as defined above.

Said first element M and the other optional elements M', ... Mm are preferably selected from the following elements: Fe, Co, Ni, Ru, Rh, Pd, Os, Ir, Pt, more particularly selected from Fe, the Co and Ni.

Said second element X and the other optional elements X', ..., $X^p$ are preferably selected from the following elements: P, As, Sn, Sb, Si, Ge and Te, and more particularly can be Sb.

Said third element and the other optional elements R', ..., R'' are preferably selected from the following elements: La, Ce, Pr, Nd, Eu, Yb, Ba, Ca, Na, K, Tl, Sr, U and more particularly selected from Ce and Yb.

The alloys which have especially been studied non-imitatively by the applicant are $Ce_yFe_{4-x}Co_xSb_{12}$ and $Yb_yFe_{4-x}Co_xSb_{12}$, with x respectively between 0 and 4, and y between 0 and 1, which are partially filled skutterudites whereof the thermoelectric properties are considered as significant. For an illustration of these electric properties the document U.S. Pat. No. 6,069,312 could be consulted for example.

Producing partially filled skutterudites $(Ce/Yb)_y Fe_{4-x}Co_xSb_{12}$ by mechanosynthesis is done from starting materials in the form of powders or leaves or more voluminous macroscopic pieces, the selected starting materials able to be pure materials or alloys (known as pre-alloyed materials).

Due to the considerable ductility of iron, cerium and ytterbium, it could be preferred to utilise as starting material for iron a Fe—Sb alloy or a powder rather than solid iron, and for the rare earths of Ce—Sb or Yb—Sb alloys rather than pure elements.

Mischmetal, which is of interest from the economical viewpoint, could also be utilised as one of the base materials.

The applicant has successfully employed mechanosynthesis to obtain skutterudite powders of sizes less than 200 nanometers by contributing work of between 85 kilojoules and 430 kilojoules.

In particular, the applicant obtained these results by employing mechanosynthesis with shock mass powers of between 2 and 10 Watts/gram of product over approximately 12 hours, under atmosphere of argon or nitrogen, in accordingly adapting the parameters and specifications of mechanosynthesis.

FIG. 1 illustrates the ratios of intensities of peaks of the skutterudite phase on peaks of the phase of one of the elements of the alloy (Sb in this case) obtained from powders after grinding, as a function of the grinding time, for shock powers of between 2 and 10 W/gram of product.

These values have been found directly from measurements by X-ray diffraction obtained on the powders produced, for different grinding durations.

The measuring points suggest a curve having a maximum of skutterudite phase corresponding to a grinding duration of approximately 12 h.

Grinding carried out at reasonable shock powers (between 2 and 10 Watts/gram of product), over a fairly long period (12 hours), thus obtain a large proportion of skutterudite phase.

Making powders from skutterudites has especially been done by the applicant under an inert argon atmosphere with mass shock powers of approximately 4 Watts/gram of product. In particular, the applicant utilised a balls/starting product mass ratio of 15/1. Good results have especially been obtained by using a rotation speed of 1020 rpm$^{-1}$ for the jar and 510 rpm$^{-1}$ for the tray.

The duration of the grinding selected was approximately 12 hours. Grinding was employed such that the worked material does not exceed a temperature limit corresponding to approximately the melting temperature of any of the elements in presence (here, the temperature limit corresponds to fusion of Sb at approximately 630° C.).

In some cases, the applicant has carried out grinding over several work time periods separated by dwell time periods long enough for the temperature of the worked material to decrease well beyond said melting temperature.

For example, the applicant employed grinding over periods of 4 hours separated by durations of one hour.

In other cases, the applicant successfully employed continuous grinding, without dwell time.

FIG. 2 shows two diffractograms of X-rays (giving as ordinates the intensities "I" as arbitrary unit) of two samples of $Ce_{0.9}Fe_4Sb_{12}$ composition, one prepared by mechanosynthesis according to the invention (with the pre-detailed parameters) corresponding to the curve 1, whereas the curve 2 corresponds to the other sample prepared by co-fusion of the elements, grinding, and long-term annealing at 700° C. according to conventional technique.

Two windows appear showing enlarged parts of two diffractograms, around respectively 31° and 90° of angle of diffraction ("2θ"). Apart from the small shoulder at the foot, left side, of the main peak 10 (revealing the presence of a minimal quantity of Sb), all the peaks of the curve 1 correspond to the peaks of the curve 2. Given that the crystalline structure is mainly skutterudite for the material corresponding to the curve 2, it can be deduced that this applies also for the material according to the invention corresponding to the curve 1. Grinding carried out over a period close to 12 hours thus produces a skutterudite phase of outstanding purity.

By comparison to the compound obtained by conventional means (curve 2), the diffraction peaks are further very clearly enlarged. By way of illustration, by observing the zoom window centred on 90° (large angles), it is not possible distinguish the $K\alpha1$ and $K\alpha2$ rays on the curve 1, contrary to the curve 2 on which these two rays are clearly distinguished for each peak.

It is even evident that the different peaks of the curve 2 are slightly convoluted.

This enlargement of the diffraction peaks is characteristic of a strong decrease in the size of the grains. The average grain size coherently diffracting the X-rays is thus estimated at less than 200 nanometers, most often of the order of 15 to 20 nanometers, by the Rietveld method (H. M. Rietveld, Acta Cryst. 22, 151 (1967) and J. Applied Cryst. 2, 65 (1969)).

With reference to FIG. 5, the applicant has confirmed these values by means of observations by electronic transmission microscopy. In the latter case, the material grain sizes are of the order of 10 to 50 nanometers; these material grains are thus nanocrystalline or nano-polycrystalline.

The refinements made by the Rietveld method have further shown that the crystalline phase is composed for approximately 95% of skutterudite phase. The applicant thus made relatively pure powders from skutterudites (>95% of skutterudite phase) in the form of nanocrystalline by mechanosynthesis. The grains of powders are mainly polycrystalline.

In addition, this photo clearly shows that the grains obtained by the process according to the invention each have an overall ovoid shape, or even spherical or quasi-spherical. The form obtained does not clearly promote a direction of the space in particular.

This form is typically associated with the production process used (mechanosynthesis) according to the invention.

This grain form especially improves compacting of the powder optionally carried out hereinafter.

To determine the possibilities of preparation of thermodynamically metastable phases, the applicant has also studied samples of formula $CeFe_{4-x}Co_xSb_{12}$. For each of the samples of this series, the results obtained by X-ray diffractograms were similar to those presented in FIG. 2, specifically concordance between the peaks of the curve 1 and those of the curve 2, and an enlargement of the peaks of the curve 1.

With reference to FIG. 3, this presents the atomic fractions (in %) deduced from results of quantitative analysis done by EDX spectroscopy (on an electronic transmission microscope of Jeol 2000FX type) on 30 grains of a powder prepared by mechanosynthesis according to the invention, this powder having been prepared so as to have a final nominal composition of $CeFe_2Co_2Sb_{12}$. The horizontal straight lines 6, 7 and 8 correspond to the nominal atomic composition of $CeFe_2Co_2Sb_{12}$, specifically respectively Sb at approximately 70.6%, Fe—Co at approximately 11.8% for each, and Ce at approximately 5.9%.

It is evident that the stoechiometry results obtained are very close to nominal stoechiometry (i.e. ideal stoechiometry): the atomic fraction of Sb is therefore, an average over the 30 samples, of the order of only 5% higher than that of the nominal compound, compensation happening at the level of Fe and Co which each have an average atomic fraction of the order of 2.5% lower than their nominal atomic fraction.

The final composition of the skutterudite obtained according to the invention is thus very close to the desired composition of the skutterudite.

On the other hand, the composition measured over thirty grains is very homogeneous, which signifies that the skutterudite powder produced according to the invention is homogeneous (all the grains of powders will have similar properties).

The thermal behaviour of different powders obtained by mechanosynthesis according to the invention was then studied by differential thermal analysis (known as "DTA").

With reference to FIG. 4, DTA results of $CeFe_2Co_2Sb_{12}$ are presented.

The curve of first heating 3 shows no peak at the melting temperature of antimony (close to 630° C.). The sample thus contains only very little antimony which has not reacted, the majority of the Sb found in the skutterudite phase.

Two wide peaks 13 and 14 are then present with inflexion points respectively in the vicinity of 830° C. and around 920° C., corresponding respectively to the range of peritectic decomposition of the skutterudite phase and to the range of decomposition of the $Fe_{4-x}Co_xSb_{12}$ phase resulting from decomposition of the skutterudite.

In the cooling curve 4 and second heating curve 5, fine peaks 11 and 12 are present around the melting temperature of Sb (here around 630° C.). This Sb effectively comes from the part of the skutterudite phase which has decomposed during the first heating 3 (around 830° C.) and which then melts during the second heating 5. The absence of peak corresponding to the fusion of the antimony in the first heating curve 3 shows that the skutterudite phase is stable at least up to 630° C.

The measurements taken by DTA on other powders of skutterudites of a different nature and/or composition have given results similar to those given earlier for the powder of $CeFe_2Co_2Sb_{12}$.

Conducting mechanosynthesis takes into account the result of these DTA measurements, the grinding being done such that the worked material remains at a temperature less than a temperature limit determined by the minimal melting temperature among the different melting temperatures of the different elements of the thermoelectric material (hereinabove, the melting temperature of Sb).

To this end, mechanosynthesis is carried out (that is, the jars and the tray are rotated if the mechanosynthesis device is a planetary grinder) over several work time periods separated by dwell time periods long enough for the temperature of the worked material to decrease well beyond said temperature limit.

An example of such mechanosynthesis use is presented above.

Once the thermoelectric powder is made, one or more steps intended to compact the pulverulent material into a single thermoelectric element can optionally be carried out. Techniques known for carrying out such an operation could be utilised (hot or cold compacting, sintering, etc.).

With reference to FIG. 6, this presents results of measurements of thermoelectric powers made on thermoelectric elements obtained after compacting at 300° C. under 400 MPa of powders of different skutterudites.

Measuring the thermoelectric power allows the thermoelectric efficacy of a material to be estimated, the thermoelectric power S being directly associated with the factor of merit ZT of the material by the formula:

$$ZT = S^2 T\sigma/\kappa$$

with T the absolute temperature (in Kelvin), S the thermoelectric power (or Seebeck coefficient), σ the electric conductivity and κ the thermal conductivity.

The thermoelectric power S was measured from 120K to 300K on the compacted elements. As per the measurements of X-ray diffraction made after compacting no chemical evolution of the samples took place during this step. However, slight thinning of the diffraction peaks was observed, characterising growth of the grains of powders, the latter however having their average sizes less than approximately 500 nanometers, or even approximately 100 nanometers.

Evolution of the thermoelectric power with the temperature is presented in FIG. 6. As expected in the case of skutterudites, the thermoelectric power increases when the temperature goes up.

The values at 300K are of the same order of magnitude as those obtained for samples prepared conventionally by fusion-annealing.

The applicant thus produced skutterudites having thermoelectric properties in the form of nanocrystalline with a very small quantity of parasitic phases, with an average material grain size of less than approximately 500 nanometers, or even less than approximately 100 nanometers for filled or partially filled skutterudites, which will facilitate subsequent shaping.

This production process does not necessarily comprise a high-temperature annealing step after synthesis, which would encumber and add substantial production costs.

Another advantage of mechanosynthesis is that it allows production in quantities adapted to industrial production, and certain reproducibility as the applicant has demonstrated.

In addition, the technique does not cause degradation of the thermoelectric power relative co conventional synthesis methods.

In addition, the nanopowders obtained can be compacted at 300° C. without chemical evolution.

Mechanosynthesis also produces compositions of filled or partially filled skutterudites in the form of nanopowders, otherwise unobtainable because of the thermodynamic metastability they exhibit, incompatible with classic production methods.

Such materials can be integrated into thermoelectric devices, utilising the Peltier and/or Seebeck effect for conversions of the two energy forms. These materials could for example be coupled to other types of materials to make multimaterial structures having gradients of thermal and/or electric conductivity.

The invention claimed is:

1. A process for producing a thermoelectric element constituted mainly by a crystalline alloy having a cubic structure, the alloy comprising:
   a first constituent having one or more first element(s) selected from Fe, Ni, or Co;
   a second constituent having second element that is Sb;
   a third constituent having one or more third element(s) selected from rare earths, actinides or a mixture of these elements;
characterised in that the process comprises making the alloy by mechanosynthesis of a worked material, and in that mechanosynthesis is carried out so as to make powders whereof the average grain size is less than approximately 500 nanometers.

2. The process for making a thermoelectric element as claimed in claim 1, characterised in that the average size of the grains of powder is less than approximately 100 nanometers.

3. The process for making a thermoelectric element as claimed in claim 1, characterised in that a first element is Fe, a third element is Ce, the starting materials utilised for the mechanosynthesis comprise Fe—Sb, Sb and Ce—Sb whereof the proportions are selected so as to obtain the desired composition of the alloy.

4. The process for making a thermoelectric element as claimed in claim 1, characterised in that a first element is Fe, a third element is Yb, the starting materials utilised for the mechanosynthesis comprise Fe—Sb, Sb and Yb—Sb whereof the proportions are selected so as to obtain the desired composition of the alloy.

5. The process for making a thermoelectric element as claimed in claim 1, characterised in that a starting material utilised is mischmetal.

6. The process for making a thermoelectric element as claimed in claim 1, characterised in that mechanosynthesis is done on starting materials in the form of powders or leaves or more voluminous macroscopic pieces, the starting materials selected are pure materials or alloys.

7. The process for making a thermoelectric element as claimed in claim 1, characterised in that mechanosynthesis is carried out so as to obtain a powder constituted at least by 95% of the alloy.

8. The process for making a thermoelectric element as claimed in claim 1, characterised in that mechanosynthesis is carried out such that the worked material does not exceed a temperature limit corresponding to approximately the melting temperature of any of the elements of the material.

9. The process for making a thermoelectric element as claimed in claim 8, characterised in that the mechanosynthesis device used is employed continuously without dwell time.

10. The process for making a thermoelectric element as claimed in claim 8, characterised in that the mechanosynthesis device used is employed over several work time periods separated by dwell time periods long enough for the temperature of the worked material to decrease well beyond said melting temperature.

11. The process for making a thermoelectric element as claimed in claim 1, characterised in that mechanosynthesis is employed so as to contribute work of between approximately 85 kilojoules and approximately 430 kilojoules.

12. The process for making a thermoelectric element as claimed in claim 11, characterised in that mechanosynthesis is employed so as to contribute a specific shock power of between approximately 2 and approximately 10 Watts per gram of product.

13. The process for making a thermoelectric element as claimed in claim 12, characterised in that a specific shock power of approximately 4 Watts/gram of product is used.

14. The process for making a thermoelectric element as claimed in claim 13, characterised in that the mechanosynthesis device is un planetary grinder comprising balls, a jar and a tray, and in that each work time period lasts between 1 hour and 5 hours for a rotation speed of the jar between approximately 750 and 1250 rpm, a rotation speed of the tray between 400 and 600 rpm, and balls selected such that the mass ratio of the balls to total mass of powder is between approximately 10 and approximately 20.

15. The process for making a thermoelectric element as claimed in claim 1, characterised in that the mechanosynthesis device is made of a material likely not to contaminate the alloy during mechanosynthesis.

16. The process for making a thermoelectric element as claimed in claim 1, characterised in that mechanosynthesis is carried out under inert gas atmosphere.

17. The process for making a thermoelectric element as claimed in claim 1, characterised in that it further comprises a compacting step for powders obtained after mechanosynthesis, to make said thermoelectric element.

* * * * *